United States Patent [19]
Estakhri et al.

[11] Patent Number: 6,125,435
[45] Date of Patent: *Sep. 26, 2000

[54] ALIGNMENT OF CLUSTER ADDRESS TO BLOCK ADDRESSES WITHIN A SEMICONDUCTOR NON-VOLATILE MASS STORAGE MEMORY

[75] Inventors: Petro Estakhri, Pleasanton; Berhau Imam, Sunnyvale, both of Calif.

[73] Assignee: Lexar Media, Inc., Fremont, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/976,557

[22] Filed: Nov. 24, 1997

Related U.S. Application Data

[63] Continuation-in-part of application No. 08/527,484, Sep. 13, 1995, and a continuation-in-part of application No. 08/831,266, Mar. 31, 1997.

[51] Int. Cl.$^7$ ..................................................... G06F 13/28
[52] U.S. Cl. ............................. 711/201; 711/200; 711/220
[58] Field of Search ................................... 711/103, 201, 711/114, 157, 113, 200, 220; 395/182.04; 365/185.09

[56] References Cited

U.S. PATENT DOCUMENTS

| | | | |
|---|---|---|---|
| 4,405,952 | 9/1983 | Slakmon | 360/49 |
| 4,450,559 | 5/1984 | Bond et al. | 371/10 |
| 4,456,971 | 6/1984 | Fukuda et al. | 364/900 |
| 4,498,146 | 2/1985 | Martinez | 364/900 |
| 4,507,731 | 3/1985 | Morrison | 711/201 |
| 4,525,839 | 7/1985 | Nozawa et al. | 371/38 |
| 4,616,311 | 10/1986 | Sato | 364/200 |
| 4,654,847 | 3/1987 | Dutton | 371/10 |
| 4,710,871 | 12/1987 | Belknap et al. | 364/200 |
| 4,746,998 | 5/1988 | Robinson et al. | 360/72.1 |

(List continued on next page.)

FOREIGN PATENT DOCUMENTS

| | | |
|---|---|---|
| 0 557 723 | 1/1987 | Australia . |
| 220 718 A2 | 5/1987 | European Pat. Off. . |

(List continued on next page.)

OTHER PUBLICATIONS

ISBN 0-07-031556-6 Book—*Computer Architecture and Parallel Processing*, Kai Hwang & Faye A. Briggs, McGraw-Hill Book Co., © 1984, p. 64.

(List continued on next page.)

*Primary Examiner*—John W. Cabeca
*Assistant Examiner*—Fred F. Tzeng
*Attorney, Agent, or Firm*—Law Office of Imam

[57] ABSTRACT

A digital system is disclosed for use with a host, the digital system including a controller and a nonvolatile memory unit having memory locations organized in blocks with each block having a plurality of sectors for storing information provided by the host in the form of non-user data files and user data files, the controller for controlling reading, writing and erasing operations performed on the nonvolatile memory, the host providing to the controller an address, identifying the starting location of the user file to the controller, and a user file identified by a starting sector address for storage within the nonvolatile memory unit. The controller finds a free block within the nonvolatile memory unit that is available for storage of information, and aligns the user file starting address with the beginning of the free block, and stores the user file within the free block starting with the beginning of the free block. If the user file extends beyond the size of the free block, the remainder of the user file is stored within blocks subsequent to the free block, wherein each time a user data file is stored in the nonvolatile memory unit, the beginning of the user data file is aligned with the beginning of the block thereby increasing performance in writing user files, and decreasing the number of erase and write operations performed on the nonvolatile memory unit.

10 Claims, 6 Drawing Sheets

U.S. PATENT DOCUMENTS

| | | | |
|---|---|---|---|
| 4,748,320 | 5/1988 | Yorimoto et al. | 235/492 |
| 4,757,474 | 7/1988 | Fukushi et al. | 365/189 |
| 4,774,700 | 9/1988 | Satoh et al. | 369/54 |
| 4,800,520 | 1/1989 | Iijima | 364/900 |
| 4,896,262 | 1/1990 | Wayama et al. | 364/200 |
| 4,914,529 | 4/1990 | Bonke | 360/48 |
| 4,920,518 | 4/1990 | Nakamura et al. | 365/228 |
| 4,924,331 | 5/1990 | Robinson et al. | 360/72.1 |
| 4,953,122 | 8/1990 | Williams | 364/900 |
| 5,070,474 | 12/1991 | Tuma et al. | 395/500 |
| 5,077,737 | 12/1991 | Leger et al. | 395/182.04 |
| 5,170,477 | 12/1992 | Potter et al. | 711/201 |
| 5,226,168 | 7/1993 | Kobayashi et al. | 395/800 |
| 5,270,979 | 12/1993 | Harari et al. | 365/218 |
| 5,297,148 | 3/1994 | Harari et al. | 371/10.2 |
| 5,301,328 | 4/1994 | Begur et al. | 711/201 |
| 5,303,198 | 4/1994 | Adachi et al. | 365/218 |
| 5,335,332 | 8/1994 | Christopher, Jr. et al. | 711/201 |
| 5,337,275 | 8/1994 | Garner | 365/189.01 |
| 5,341,330 | 8/1994 | Wells et al. | 365/185 |
| 5,341,339 | 8/1994 | Wells | 365/218 |
| 5,353,256 | 10/1994 | Fandrich et al. | 365/230.03 |
| 5,357,475 | 10/1994 | Hasbun et al. | 365/218 |
| 5,388,083 | 2/1995 | Assar et al. | 365/218 |
| 5,422,998 | 6/1995 | Margolin | 711/201 |
| 5,430,859 | 7/1995 | Norman et al. | 395/425 |
| 5,479,638 | 12/1995 | Assar et al. | 395/430 |
| 5,485,595 | 1/1996 | Assar et al. | 395/430 |
| 5,524,230 | 6/1996 | Sakaue et al. | 395/430 |
| 5,544,356 | 8/1996 | Robinson et al. | 395/600 |
| 5,555,391 | 9/1996 | De Subijana et al. | 711/113 |
| 5,561,784 | 10/1996 | Chen et al. | 711/157 |
| 5,640,528 | 6/1997 | Harney et al. | 711/201 |
| 5,835,935 | 11/1998 | Estakhri et al. | 711/103 |
| 5,838,614 | 11/1998 | Estakhri et al. | 711/103 |
| 5,845,313 | 12/1998 | Estakhri et al. | 711/103 |

FOREIGN PATENT DOCUMENTS

| | | |
|---|---|---|
| 0 243 503 A1 | 11/1987 | European Pat. Off. . |
| 0 424 191 A2 | 4/1991 | European Pat. Off. . |
| 0 489 204 A1 | 6/1992 | European Pat. Off. . |
| 0 522 780 A2 | 1/1993 | European Pat. Off. . |
| 0 544 252 A2 | 6/1993 | European Pat. Off. . |
| 0 686 976 A2 | 12/1995 | European Pat. Off. . |
| 93 01908 | 8/1993 | France . |
| 59-45695 | 9/1982 | Japan . |
| 58-215794 | 12/1983 | Japan . |
| 58-215795 | 12/1983 | Japan . |
| 60-212900 | of 1985 | Japan . |
| 61-96598 | 5/1986 | Japan . |
| 62-283496 | 12/1987 | Japan . |
| 62-283497 | 12/1987 | Japan . |
| 63-183700 | 7/1988 | Japan . |
| 4-332999 | 11/1992 | Japan . |
| 84/00628 | 2/1984 | WIPO . |

OTHER PUBLICATIONS

1990 WL 2208325 Magazine—"State of the Art: Magnetic VS. Optical Store Data in a Flash", by Walter Lahti and Dean McCarron, Byte magazine dated Nov. 1, 1990, 311, vol. 15, No. 12.

G11C16/06 P4A1 Magazine—Technology Updates, Integrated Circuits, "1–Mbit flash memories seek their role in system design", Ron WIlson, Senior Editor, Computer Design magazine 28 (1989) Mar. 1, No. 5, Tulsa OK, US, pp. 30 and 32.

Serial 9Mb F 1992 Symposium of VLSI Circuits Digest of Technical Papers, "EEPROM for Solid State Disk Applications", S. Mehoura et al., SunDisk Corporation, Santa Clara, CA R. W. Gregor et al., AT&T Bell Laboratories, Allentown, PA. pp. 24 and 25.

1030

| | Block Address | OLD | USED | DEFECT |
|---|---|---|---|---|
| LBA0 | 1 | 0 | 0 | 0 |
| LBA1 | 7 | 0 | 1 | 0 |
| LBA2 | X | 0 | 0 | 1 |
| LBA3 | 3 | 0 | 0 | 0 |
| LBA4 | | | | |
| LBA5 | 8 | 0 | 1 | 0 |
| ⋮ | | | | |
| LBAN | | | | |

| | DATA (1042) | ECC (1044) | LBA (1046) | FLAGS (1048) | | |
|---|---|---|---|---|---|---|
| | | | | OLD | USED | DEFECT |
| 0 | | | | | | |
| 1 | | | | | | |
| 2 | | | | | | |
| 3 | | | | | | |
| 4 | | | | | | |
| ⋮ | | | | | | |
| 10 | | | | | | |
| 11 | | | | | | |
| 12 | | | | | | |
| 13 | | | | | | |
| 14 | | | | | | |
| 15 | | | | | | |

ALIGNMENT OF CLUSTER ADDRESS TO BLOCK ADDRESSES WITHIN A SEMICONDUCTOR NON-VOLATILE MASS STORAGE MEMORY

CROSS REFERENCE TO RELATED APPLICATIONS

This application is a continuation-in-part of our prior U.S. patent application Ser. No. 08/527,484, filed Sep. 13, 1995, entitled "METHOD OF AND ARCHITECTURE FOR CONTROLLING SYSTEM DATA WITH AUTOMATIC WEAR LEVELING IN A SEMICONDUCTOR NON-VOLATILE MASS STORAGE MEMORY" and a continuation-in-part of our prior U.S. patent application Ser. No. 08/831,266 filed Mar. 31, 1997, entitled "MOVING SECTORS WITHIN A BLOCK OF INFORMATION IN A FLASH MASS STORAGE ARCHITECTURE."

BACKGROUND OF THE INVENTION

1. Field of the Invention

This invention relates generally to semiconductor mass storage systems and methods of operating thereof, and more particularly to digital systems, such as PCs, using nonvolatile memory devices in lieu of conventional hard disk drives and digital cameras using nonvolatile memory devices in lieu of conventional films for storage of large quantities of informational data wherein the information being stored in the nonvolatile memory is organized and aligned in such a way so as to maximize the performance of the digital system.

2. Description of the Prior Art

Computers conventionally use rotating magnetic media for mass storage of documents, data, programs and information. Though widely used and commonly accepted, such hard disk drives suffer from a variety of deficiencies. Because of the rotation of the disk, there is an inherent latency in extracting information from a hard disk drive.

Other problems are especially dramatic in portable computers. In particular, hard disks are unable to withstand many of the kinds of physical shock that a portable computer will likely sustain. Further, the motor for rotating the disk consumes significant amounts of power decreasing the battery life for portable computers.

Solid state memory is an ideal choice for replacing a hard disk drive for mass storage because it can resolve the problems cited above. Potential solutions have been proposed for replacing a hard disk drive with a semiconductor memory. For such a system to be truly useful, the memory must be non-volatile and alterable. The inventors have determined that FLASH memory is preferred for such a replacement.

Similarly, in uses other than PCs, such as digital cameras, solid state memory is employed to maintain the digital information that is collected, such as a picture frame, to replace the films used in conventional cameras. Upon collection of a picture frame or preferably a number of frames, the digital system, which may appear in the form of a card, is inserted in a computer where it may be edited, stored or used in other ways. For such systems, the memory that is used to maintain the picture frames must also be nonvolatile yet alterable; FLASH memory is a viable device for such usage.

Devices manufactured using technologies such as FLASH memory need to be programmed before erasing to improve uniformity amongst all cells. They also have to be verified for successful erase.

One requirement for successfully employing a semiconductor mass storage device in lieu of rotating media hard disk mass storage device or film is that its use must be transparent to the computer's operating system and the user of a system using such a device. In other words, the designer or user of a computer incorporating such a semiconductor mass storage device could simply remove the hard disk and replace it with a semiconductor mass storage device. All presently available commercial software should operate on a system employing such a semiconductor mass storage device without the necessity of any modification.

Conventional computer systems include a mass storage memory facility for storing user information such as data and applications files (user files). In addition to storing such data and applications files, conventional systems also store non-user information in the mass storage memory facility for use by the computer system in controlling the general operation of the computer and its related peripheral systems (system files). In DOS-based systems, such system information includes the boot sector, the FAT tables and the directory information.

Within a flash memory device, the write and erase operation take the most time to perform. Accordingly, it would be advantageous to not have to perform an erase operation every time a system file or a user file is updated. Prior art techniques include writing a user file to other areas of the nonvolatile memory each time it is updated in order to avoid erase operations. This is best illustrated through an example.

FIG. 1 is an example of the organization of user data information in nonvolatile memory unit 100 and a look-up-table 102 preferably stored within a volatile memory unit (not shown) as employed by a prior art system. Look-up-table 102 represents a mapping of Logical Block Addresses (LBAs) to corresponding block addresses within the nonvolatile memory unit 100 wherein the user data file is actually stored. Each LBA identifies the location of a 512 byte (or a sector) portion of the user data file. A block within the nonvolatile memory unit 100 comprises of 16 LBAs and therefore each row of the look-up-table 102 (such is 104, 106, 108, . . . ) includes information regarding the status of a 16-sector block.

Specifically, the block address field 112 in look-up-table 102 specifies the block location within the nonvolatile memory where information identified by LBA values resides. For example, in accordance with the contents of row 104, information identified by LBAs 0–15 correspond to block address 0. A 'used' flag field 112 and an 'old' flag field 114 identify the state of a block within the nonvolatile memory. The 'used' flag field 112, when set to a logic state '1' indicates that the block identified by the corresponding block address 110 of the row in which the 'used' flag resides has been written to and is therefore in use, whereas a logic state '0', as represented by the 'used' flag, indicates that the block is available or free to be written. A logic state of '1' represented by the 'old' flag 114, indicates that the block addressed by the block address of the corresponding row in which the used flag resides is not to be accessed prior to being erased.

The nonvolatile memory 100 wherein the user files are stored, is organized into blocks, such as Block 0, Block 1, etc. Each such block within the nonvolatile memory is identified by an address represented by the block address field 110 and comprises of 16 sectors. In the example of FIG. 1, Block 0, Block 1 and Block 2 were previously written, as indicated by the state of their corresponding 'used' flags in look-up-table 102. In this respect, the information identified by LBAs 0–15, LBAs 16–31 and LBAs 32–47, or at least some of these LBAs, has been written.

In FIG. 2, the example cited above is carried through to illustrate the case where 8 sectors starting from LBA 29 (or '1D' in Hexadecimal notation) is updated with new information. As is obvious to those of ordinary skill in the art, the location in nonvolatile memory 100 wherein LBA 29, for example, was stored, i.e., Block 1, can not be re-written because no erase operations were performed since the last write operation to this location. The information that is to be updated in LBA 29 through 36 then needs to be stored elsewhere, in an available location within the nonvolatile memory 100.

Assuming that the next available location within the nonvolatile memory unit is Block 3, the information identified by LBA 29, 30, and 31 is written to Block 3 of the nonvolatile memory 100 and even though the information identified by LBA 16–28 is not being effected, it is nevertheless moved from Block 1 to Block 3 of the nonvolatile memory 100. This is due to setting the state of Block 1 to where it can be erased. In other words, the information that resided in Block 1 that was not to be accessed is still having to be moved in order to allow erasure of that block. In fact, this is the reason for setting the state of the 'old' flag 114 of row 106 in the look-up-table 102 to logic state '1'.

The remainder of the LBA-identified information, i.e. LBA 32–36, is written to the next available block within nonvolatile memory 100, such as Block 4. Information identified by LBA 32–36 is written to sectors 0–4, respectively, of Block 4. Furthermore, since LBA 32–47 in row 108 corresponded to Block 2 previously (see FIG. 1), sectors 5–15 of Block 2 are then moved to like sector locations of Block 4, after which Block 2 may be erased.

Through the above example, illustrated by FIGS. 1 and 2, it should be obvious to those of ordinary skill in the art, that where a user file, whose starting address is LBA 29, is being updated, information from two blocks is moved from one block location to another even though there are only 8 sectors, which is less than the number of sectors in a block, being accessed.

In such prior art techniques, the performance of the system is substantially effected due to the number of write operations included in moving sectors that are not necessarily being accessed, yet belonging to a block where user files are updated. As earlier stated, write operations are time consuming and lead to degradation of system performance as do move operations since a move operation necessarily includes performing write operations. Examples of such prior art systems are provided in earlier-filed U.S. patent applications, Ser. No. 08/527,484, filed Sep. 13, 1995 and entitled "METHOD OF AND ARCHITECTURE FOR CONTROLLING SYSTEM DATA WITH AUTOMATIC WEAR LEVELING IN A SEMICONDUCTOR NON-VOLATILE MASS STORAGE MEMORY" with inventors Petro Estakhri, Mahmud Assar, Robert Reid, and Berhanu Iman and Ser. No. 08/831,266, filed Mar. 31, 1997, entitled "MOVING SECTORS WITHIN A BLOCK OF INFORMATION IN A FLASH MASS STORAGE ARCHITECTURE" with inventors Petro Estakhri, Berhau Iman, and Ali Ganjuei. The disclosures of both of these documents are herein incorporated by reference.

A method and apparatus is therefore needed for updating user files, having various block sizes, that are maintained in nonvolatile memory devices of digital systems, such as PCs and digital cameras, whereby the number of move and therefore write operations is minimized resulting in increased system performance.

SUMMARY OF THE INVENTION

It is an object of the present invention to increase the performance of a digital system employing nonvolatile memory under the control of a controller circuit, the digital system being used by the controller circuit to store user data files.

It is another object of the present invention described herein to achieve performance enhancement by reducing the number of write operations performed by the controller on the nonvolatile memory when storing user files therein.

Briefly, a preferred embodiment of the present invention includes a digital system for use with a host, the digital system including a nonvolatile memory unit having memory locations organized in blocks with each block having a plurality of sectors for storing information provided by the host, through a controller, in the form of non-user data files and user data files. The controller being operative to control the reading, writing and erasing operations performed on the nonvolatile memory, the host for providing an address identifying the starting location of the user file to the controller wherein the host provides a user file identified by a starting sector address for storage within the nonvolatile memory unit to the controller. The controller finds a free block within the nonvolatile memory unit that is available for storage of information and aligns the user file starting address with the beginning of the free block and stores the user file within the free block starting with the beginning of the free block. If the user file extends beyond the size of the free block, storing the remainder of the user file within blocks subsequent to the free block, wherein each time a user data file is stored in the nonvolatile memory unit, the beginning of the user data file is aligned with the beginning of the block thereby increasing the performance of writing user files and decreasing the number of erase and write operations performed on the nonvolatile memory unit.

BRIEF DESCRIPTION OF THE DRAWINGS

FIG. 6 is a chart showing an example of the contents of the SPM RAM 548 of FIG. 3.

FIG. 7 is a chart illustrating the organization of a block of information in the memory unit 508 of FIG. 3.

DETAILED DESCRIPTION OF THE PREFERRED EMBODIMENT

Figure 1:
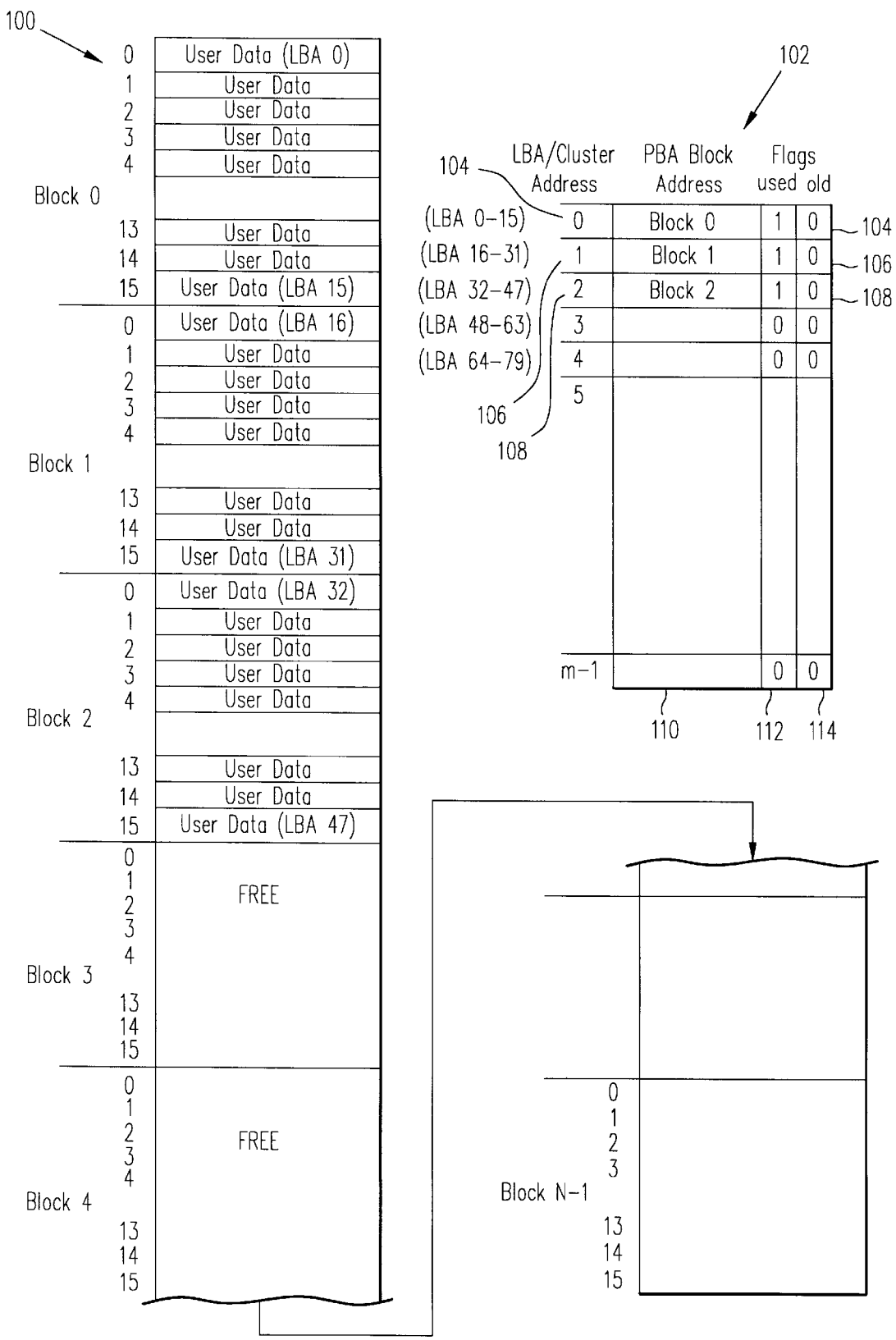
FIGS. 1 and 2 are diagrams showing examples of the contents of a nonvolatile memory and a corresponding look-up-table, as employed by prior art systems.
Figure 2:
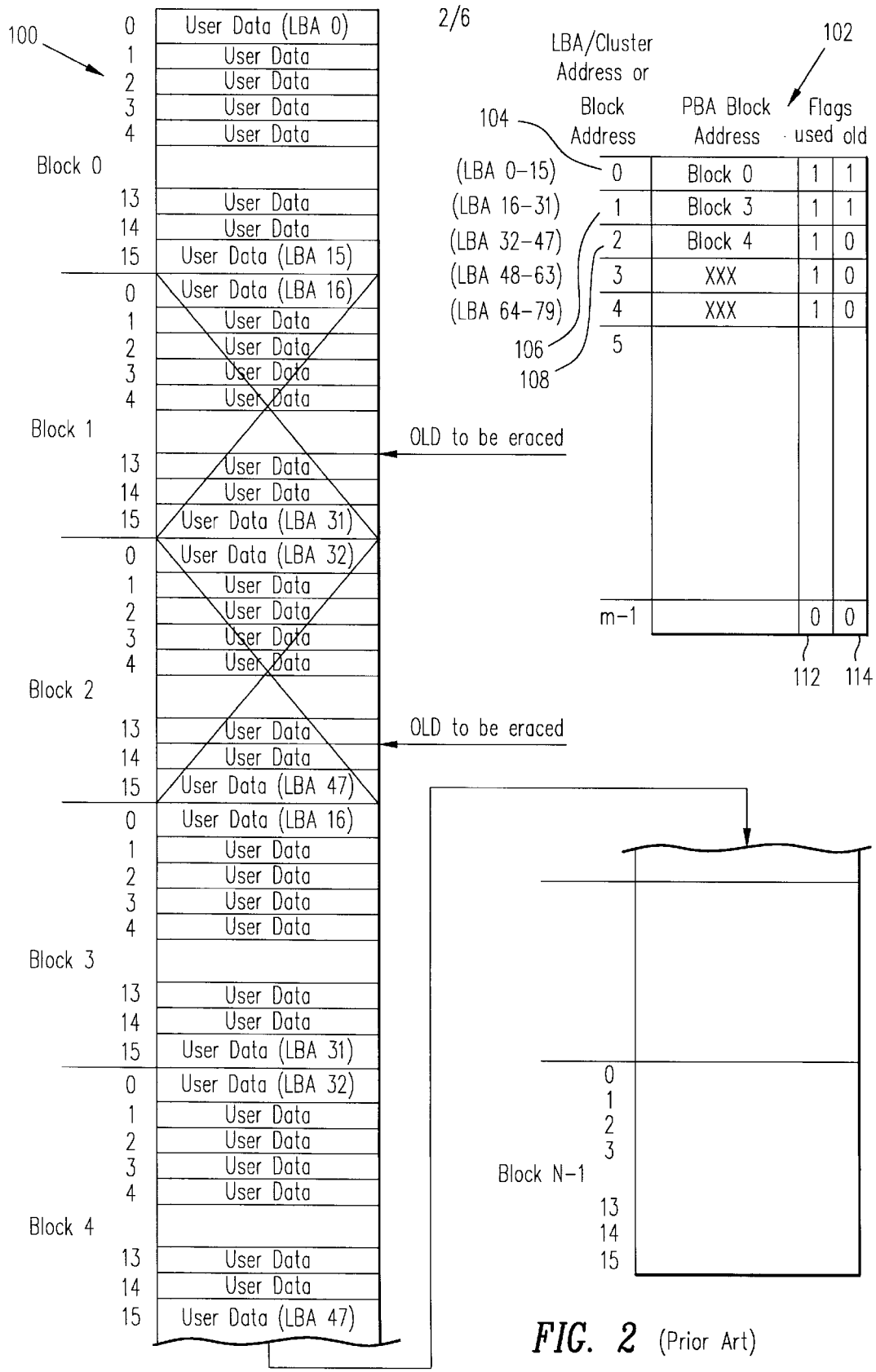
Figure 3:
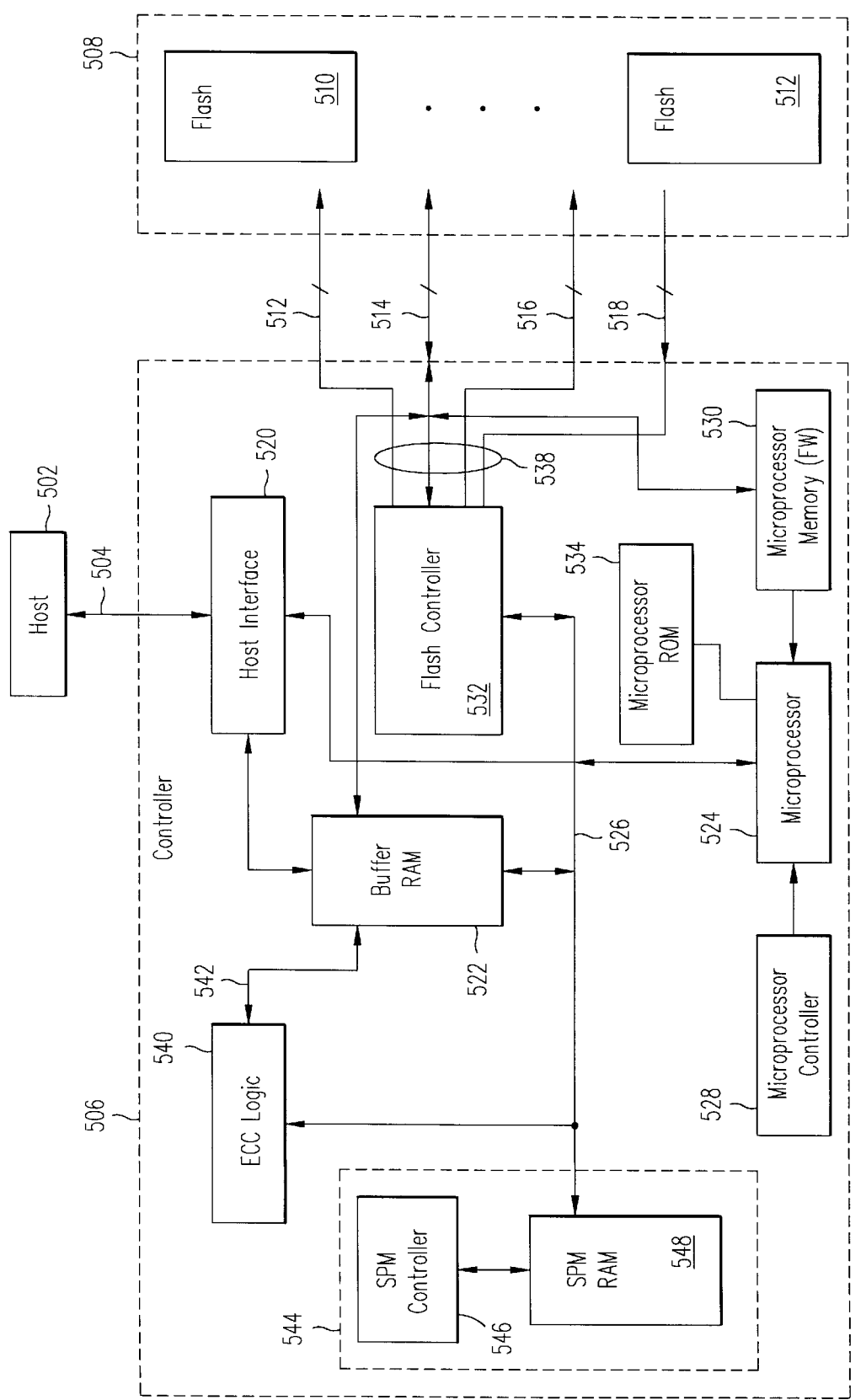
FIG. 3 illustrates a high-level block diagram of a digital system in accordance with the preferred embodiment of the present invention.

Referring now to FIG. 3, a general high-level block diagram of a digital system 500, such as a digital camera or a personal computer (PC), is depicted to include a controller 506 for performing operations, such as writing, reading and erasing, on a non-volatile memory unit 508. The controller 506 is coupled to a host 502, which may be a central processing unit (CPU), commonly employed in digital systems, that initiates reading and writing operations to be performed on the nonvolatile memory unit 508 through the controller 506. The controller 506 may be a semiconductor (otherwise referred to as an "integrated circuit" or "chip") or optionally a combination of various electronic components. In the preferred embodiment, the controller 506 is shown to be a single chip device.

The non-volatile memory unit 508 is comprised of one or more memory devices, which may each be flash or EEPROM types of memory. In the preferred embodiment of FIG. 3, memory unit 508 includes a plurality of flash memory devices, 510–512, each flash device includes individually addressable locations for storing information. In the preferred application of the embodiment of FIG. 3, such information is organized in blocks with each block having one or more sectors of data. In addition to the data, other types of information is stored in the nonvolatile memory unit 508, such as status information regarding the data blocks in the form of flag fields, in addition to block address information, and the like.

The host 502 is coupled through host information signals 504 to the controller circuit 506. The host information signals comprise of address and data busses and control signals for communicating command, data and other types of information to the controller circuit 506, which in turn stores such information in memory unit 508 through flash address bus 512, flash data bus 514, flash signals 516 and flash status signals 518 (508 and 512–516 collectively referred to as signals 538). The signals 538 provide command, data and status information between the controller 506 and the memory unit 508.

The controller 506 is shown to include high-level functional blocks such as a host interface block 520, a buffer RAM block 522, a flash controller block 532, a microprocessor block 524, a microprocessor controller block 528, a microprocessor storage block 530, a microprocessor ROM block 534, an ECC logic block 540 and a space manager block 544. The host interface block 520 receives host information signals 504 for providing data and status information from buffer RAM block 522 and microprocessor block 524 to the host 502 through host information signals 504. The host interface block 520 is coupled to the microprocessor block 524 through the microprocessor information signals 526, which is comprised of an address bus, a data bus and control signals.

The microprocessor block 524 is shown coupled to a microprocessor controller block 528, a microprocessor storage block 530 and a microprocessor ROM block 534, and serves to direct operations of the various functional blocks shown in FIG. 3 within the controller 506 by executing program instructions stored in the microprocessor storage block 530 and the microprocessor ROM block 534. Microprocessor 524 may, at times, execute program instructions (or code) from microprocessor ROM block 534, which is a non-volatile storage area. On the other hand, microprocessor storage block 530 may be either volatile, i.e., read-and-write memory (RAM), or non-volatile, i.e., EEPROM, type of memory storage. The instructions executed by the microprocessor block 524, collectively referred to as program code, are stored in the storage block 530 at some time prior to the beginning of the operation of the system of the present invention. Initially, and prior to the execution of program code from the microprocessor storage location 530, the program code may be stored in the memory unit 508 and later downloaded to the storage block 530 through the signals 538. During this initialization, the microprocessor block 524 can execute instructions from the ROM block 534.

The controller 506 further includes a flash controller block 532 coupled to the microprocessor block 524 through the microprocessor information signals 526 for providing and receiving information from and to the memory unit under the direction of the microprocessor. Information such as data may be provided from flash controller block 532 to the buffer RAM block 522 for storage (may be only temporary storage) therein through the microprocessor signals 526. Similarly, through the microprocessor signals 526, data may be retrieved from the buffer RAM block 522 by the flash controller block 532.

The ECC logic block 540 is coupled to buffer RAM block 522 through signals 542 and further coupled to the microprocessor block 524 through microprocessor signals 526. ECC logic block 540 includes circuitry for generally performing error coding and correction functions. It should be understood by those skilled in the art that various ECC apparatus and algorithms are commercially available and may be employed to perform the functions required of ECC logic block 540. Briefly, these functions include appending code that is for all intensive purposes uniquely generated from a polynomial to the data being transmitted and when data is received, using the same polynomial to generate another code from the received data for detecting and potentially correcting a predetermined number of errors that may have corrupted the data. ECC logic block 540 performs error detection and/or correction operations on data stored in the memory unit 508 or data received from the host 502.

The space manager block 544 employs a preferred apparatus and algorithm for finding the next unused (or free) storage block within one of the flash memory devices for storing a block of information, as will be further explained herein with reference to other figures. As earlier discussed, the address of a block within one of the flash memory devices is referred to as Physical Block Address (PBA), which is determined by the space manager by performing a translation on an LBA received from the host. A variety of apparatus and method may be employed for accomplishing this translation. An example of such a scheme is disclosed in U.S. Pat. No. 5,485,595, entitled "Flash Memory Mass Storage Architecture Incorporating Wear Leveling Technique Without Using CAM Cells", the specification of which is herein incorporated by reference. Other LBA to PBA translation methods and apparatus may be likewise employed without departing from the scope and spirit of the present invention.

Space manager block 544 includes SPM RAM block 548 and SPM control block 546, the latter two blocks being coupled together. The SPM RAM block 548 stores the LBA-PBA mapping information in a look-up-table under the control of SPM control block 546.

In operation, the host 502 writes and reads information from and to the memory unit 508 during for example, the performance of a read or write operation through the controller 506. In so doing, the host 502 provides an LBA to the controller 506 through the host signals 504. The LBA is received by the host interface block 520. Under the direction of the microprocessor block 524, the LBA is ultimately provided to the space manager block 544 for translation to a PBA and storage thereof, as will be discussed in further detail later.

Under the direction of the microprocessor block 524, data and other information are written into or read from a storage area, identified by the PBA, within one of the flash memory devices 510–512 through the flash controller block 532.

In FIG. 3, the SPM RAM block 548 maintains a table that may be modified each time a write operation occurs thereby maintaining the LBA-PBA mapping information and other information regarding each block being stored in memory unit 508. Additionally, this mapping information provides the actual location of a sector (within a block) of information within the flash memory devices. As will be further apparent, at least a portion of the information in the mapping table stored in the SPM RAM block 548 is "shadowed" (or copied) to memory unit 508 in order to avoid loss of the mapping information when power to the system is interrupted or terminated. This is, in large part, due to the use of volatile memory for maintaining the mapping information. In this connection, when power to the system is restored, the portion of the mapping information that is stored in the memory unit 508 is transferred back to the SPM RAM block 548.

It should be noted, that the SPM RAM block 548 may alternatively be nonvolatile memory, such as in the form of flash or EEPROM memory architecture. In this case, the mapping table will be stored within nonvolatile memory thereby avoiding the need for "shadowing" because during power interruptions, the mapping information stored in nonvolatile memory will be clearly maintained.

As noted above, information stored in memory unit 508 is organized into blocks, with each block being addressable and erasable as a unit and including a plurality of sectors. For the purposes of illustrating an example, a block includes 16 sectors. Thus, user files are also organized into blocks when they are stored in the memory unit 508.

Figure 4:
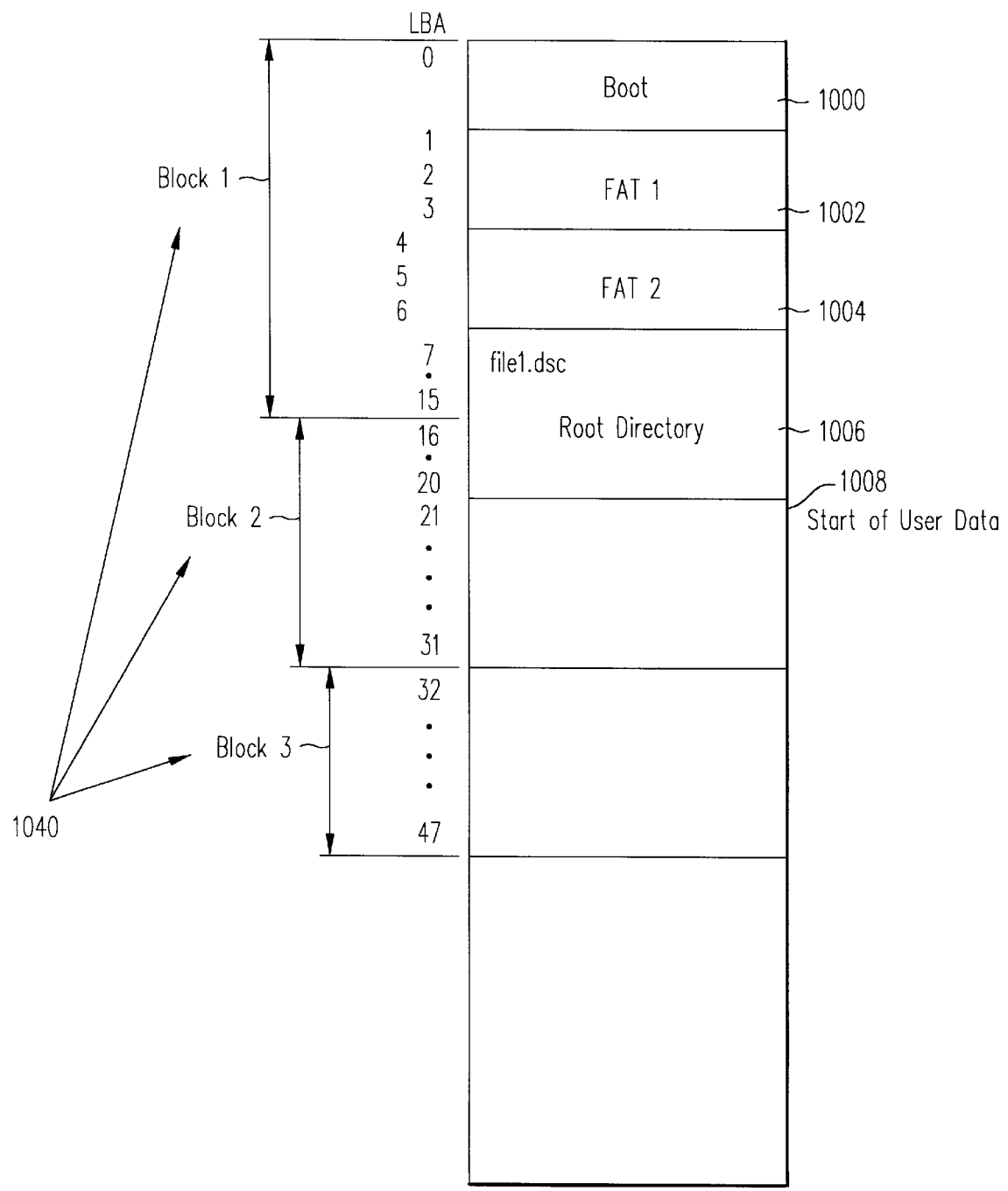
FIG. 4 is a diagram showing an example of the contents of the memory unit 508 shown of FIG. 3.

In PCs (particularly laptop computers) and digital camera systems 500 employing non-volatile memory devices and running on DOS operating system, information is organized in accordance with a particular format within the memory unit 508. This particular format is generally dictated by driver (or BIOS) manufacturers like SystemSoft. FIG. 4 illustrates an example of the organization of information within the memory unit 508 during manufacturing of the digital system 500. An area of the memory unit 508 is designated to store Boot code 1000, which area is addressed by LBA 0. An area of memory, addressed by LBA 1–3, is used to store FAT1 1002 and another area of memory, addressed by LBA 4–6, is used to store FAT2 1004. A further area of memory, addressed by LBA 7–20, is used to store Root Directory information 1006, i.e. those files that are generally maintained in the main directory of the system upon start-up. Starting from a particular location within the memory unit 508, as determined by driver manufacturers, there is storage space allocated for maintaining user data (or user files) 1008. In the example of FIG. 4, the starting location of the user data is 21 (or 16 in Hexadecimal notation).

In prior art systems, the starting address of a user file, defined by an LBA value provided by the host, is used to locate a corresponding address within the mass storage memory 100 which may happen to fall in the middle of a block. For example, if a user file was addressed starting from LBA by the host, LBA 5, or a corresponding PBA value of LBA 5 may be the sixth sector location within a first block of the memory unit 508. In this case, the user file will be stored starting from the sixth sector location of a block and will continue to be stored in succeeding blocks to the extent required for storing the entire file. The end of the file may again happen to fall in the middle of the last block in which the user file is being stored. Thus, the first portion of the first block (namely, the first 5 sectors of the first block) and some portion of the last block wherein the user file is stored remains unused resulting in overhead of removing those sectors.

Figure 5:
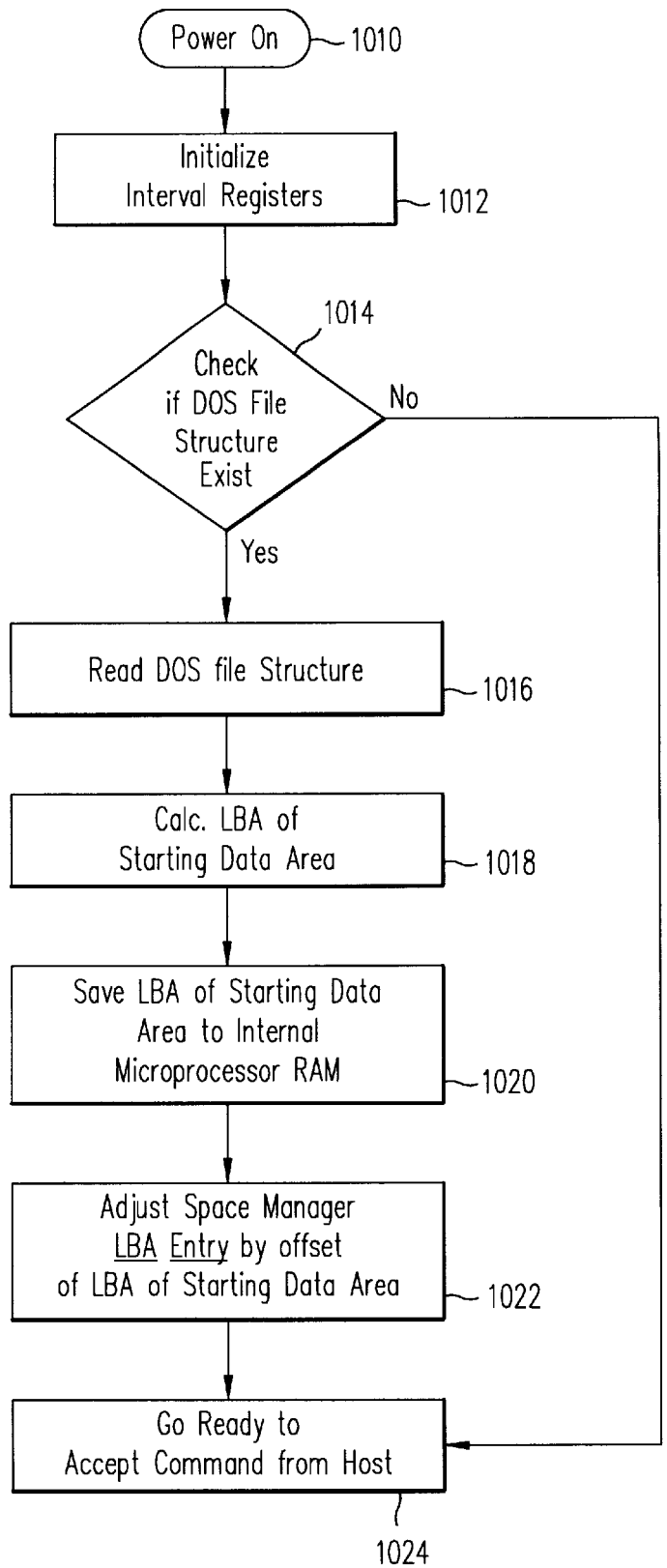
FIG. 5 is a flow chart representation of the steps executed by the controller 506 of FIG. 3 in processing information.

In the system of the present invention, microcode (comprised of firmware instructions) is executed by the microprocessor block 524 (in FIG. 3) to carry out the steps outlined in flow chart format in FIG. 5 for aligning the starting address of a user file that is to be stored within the memory unit 508 with the starting location of a block. When the system is first powered on at step 1010, the microprocessor will initialize SPM RAM 548 (in FIG. 3), the microprocessor RAM block 530 and the host interface 520. Then the mode in which the system will operate, i.e., PCMCIA or IDE mode will be detected and set.

Next, the controller 506 looks for the presence of a DOS-type file structure at step 1014. It does so by reading the Boot code, which resides at LBA 0, and checks for a DOS signature, which may be a 55AA (Hex) pattern that is written at the last byte of the 512-byte sector identified by LBA 0. If a DOS type file structure exists, then at step 1016, the DOS file structure is read from the Boot Code 1000 area of memory unit 508 (shown in FIG. 3). As noted above, the Boot Code includes information regarding each of the different types of information, such as FAT1, FAT2, Root Directory, etc. that are stored within the memory unit 508. At step 1018, the controller 506 calculates an LBA for identifying the starting address location within the memory unit 508 wherein the user files are stored. That is, by obtaining information regarding the Boot Code at 1000, being identified by LBA 0, and FAT1, being by identified by LBA 0–3, and FAT2, being identified by LBA 4–6, and the Root Directory, being identified by LBA 7–20. In this case, we add 11 to LBA 0 so that the start of the user data is equal to the beginning of the flash block.

At step 1020, the offset LBA, in this case LBA 11, is saved to a volatile location within the controller 506 such as within a register of the microprocessor storage block 530. Each time an LBA value is provided by the host for writing or reading a user file, the host-provided LBA is modified by the controller to add the offset LBA therefrom. The modified LBA is obtained by adding the offset LBA from the host-provided LBA value. The modified LBA is then used to determine the block boundary of the next subsequent block within the memory unit 508 (as will be further discussed with respect to an example) in order to align the starting address of the user data file with the starting address of a block. The LBA associated with the block boundary is then divided by 16 and used to address the rows of SPM RAM block 548 look-up-table at step 1022.

By way of example, to access a user file within the memory unit 508, the host provides an LBA value of 21 (15 in Hex. notation) as the starting location of the user file. The controller adds the offset LBA value 11 ('0B' in Hex. notation) to obtain LBA 32 (20 in Hex. notation). As earlier explained, since each block within the memory unit 508 is comprised of 16 sectors, i.e., block boundaries are 16 sectors apart, and sectors with associated LBA values of 0, 16 (10 in Hex.), 32 (20 in Hex.), 48 (30 in Hex.), 64 (40 in Hex.), etc. (block boundaries) define the beginning of a block. LBA 32 (20 in Hex.) will be mapped to the next block boundary of the memory unit 508, which is LBA 32 (20 in Hex.). LBA 32 (20 in Hex.)is further translated by shifting the corresponding hexadecimal value of the value 20 (in Hex.) by 4 least significant bits to the right, or dividing 32 by 16 to obtain 2, which is used as the LBA row address to obtain a block address associated therewith in SPM RAM block 548.

In FIG. 5, if it is determined that a DOS file structure is not being employed, the following step that is executed is step 1024 and no alignment of the LBA starting block locations with the starting location of user files need be performed.

FIG. 6 shows an example of a table 1030 maintained in the SPM RAM block 548, which table is defined by a number of rows and columns, each row being addressed by an LBA. Within row 3 (shown as LBA3), there is stored a block address value, i.e. block address 3. This is the block address that has been earlier assigned to that LBA row by the space manager block as discussed above. Block address 3 defines the starting location for identifying the block within the memory unit 508 where the user file is stored. The least significant 4 bits which were used to shift the value '20' (in Hex.) are then concatenated with the block address 3 to point to a sector within the block. In the above example where LBA 32 (20 Hex.) was used, the value '0' would be concatenated to the value '2' resulting in the value '20' in Hex. notation (or 32 in decimal notation). The 33rd sector counting from the top of the memory unit 508 (or the first sector of the third block, sector 32), in FIG. 4, is the first location from which the user file has been stored.

In this manner, the present invention reduces the performance degradation associated with the usage of the memory unit 508 for storing user files in a block-organized fashion, accordingly, decreasing the overall rate of write and erase operations that the memory unit 508 experiences. That is, since the performance of a write operation is time consuming, a reduction in the number of write operations necessarily increases sytem performance and further improves the longevity of the flash memory devices of the memory unit 508.

FIG. 7 depicts more details of the organization of the memory unit 508. A block 1040 of information includes 16 sectors in the preferred embodiment of the present invention as discussed above, although a block may include other than 16 sectors. Each sector 1050 includes a data field 1042, which is generally 512 bytes (each byte being 8 bits) although it may be a size other than 512 bytes, an ECC field 1044, an address field 1046 and a flag field 1048. The ECC field 1044 is an error correction code, as discussed earlier, relating to the data 1042. The address field 1046 provides information regarding the location of the block 1040 within the memory unit 508. That is, the row number corresponding to the block 1040, as indicated by the look-up-table 1030 in the SPM RAM, is stored in the address field 1046. The flag field 1048 includes information regarding the status of the block 1040. This information includes an 'old', 'used', and 'defect' flags. The 'old' and 'used' flags are as explained with reference to the prior art and the 'defect' flag indicates whether the block 1040 includes any defective sectors therein, in which case the block is not used for storing information. It should be noted that the address field 1046 and the flag field 1048 both relate to the block 1040 whereas the ECC field 1044 relates to the data 1042 in each sector 1050. Alternatively, the address field 1046 may be stored in one sector of the block 1040, such as the last sector, rather than in each sector of the block 1040. Similarly, the flag field 1048 need only be stored in one of the sectors of the block 1040, such as the first or last sectors. The ECC field 1044 and clearly the data field 1042 for each sector are maintained in the corresponding sector within the block 1040.

The present invention has been described in terms of specific embodiments incorporating details to facilitate the understanding of the principles of construction and operation of the invention. such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A method of improving the performance of a digital data storage system for use with a host, the digital system including a controller and a nonvolatile memory unit having memory locations organized by blocks, with each block having a plurality of sectors for storing host provided information in the form of non-user data files and user data files, the controller being operative to control the reading, writing and erasing operations performed on the nonvolatile memory, the host being operative to provide an address identifying the starting location of the user file to the controller, the method comprising:

a. receiving a user file identified by a starting sector address for storage within the nonvolatile memory unit;

b. finding a free block having a first sector within the nonvolatile memory unit that is available for storage of information, the free block having a size defined by a plurality of sectors;

c. adding an offset value to the starting sector address of the user file, the starting sector address of the user file being identified by a host-provided logical block address (LBA);

d. aligning the user file starting sector address with the first sector of the free block, the LBA being aligned with the beginning of the free block;

e. shifting the aligned LBA by the number of sectors within a block;

f. storing the user file within the free block starting with the first sector of the free block; and g. if the user file extends beyond the size of the free block, storing the remainder of the user file within blocks subsequent to the free block, wherein each time a user data file is stored in the nonvolatile memory unit, the beginning of the user data file is aligned with the first sector of the free block thereby increasing the performance of the digital system by decreasing the number of erase and write operations when storing user files.

2. A method as recited in claim 1 and further comprising the step of providing a look-up-table defined by rows and columns, the aligned LBA being used to address a row of the look-up-table and within the addressed row, a block address being stored for addressing the available block.

3. A method as recited in claim 1 wherein said shifting step further includes the step of right shifting the aligned LBA by a plurality of bits representing the number of sectors in a block for obtaining the block address.

4. A method as recited in claim 3 and further comprising the step of concatenating the plurality of bits to the block address for addressing a particular sector of the available block.

5. A method as recited in claim 3 and further comprising the step of concatenating the plurality of bits to the block address for addressing a first sector within the available block.

6. A controller included in a digital system for causing read, write, erase and move operations to be performed on a nonvolatile memory unit, the nonvolatile memory unit for storing user data files organized in blocks, the digital system being coupled to a host for receiving user files therefrom, comprising:

means for receiving an LBA provided by the host, said LBA identifying the beginning of a user data file to be stored within the nonvolatile memory unit;

means for adding an offset LBA value to the received LBA to calculate an aligned LBA;

means for shifting the aligned LBA by the number of sectors within a block;

means for aligning the beginning of the user data file with the first sector of a block within the nonvolatile memory that is available for storage of information; and storage means for storing the user file within the available block starting from the first sector thereof, and if the user file is larger than the size of the available block, for further storing the remainder of the user file in subsequent blocks, wherein each time a user data file is stored in the nonvolatile memory unit, the beginning of the user data file is aligned with the first sector of the available block thereby increasing the performance of the digital system by decreasing the number of erase and write operations when storing user data files.

7. A controller as recited in claim 6 and further comprising a space manager for identifying the available block.

8. A controller as recited in claim 7 wherein the space manager includes a look-up-table defined by rows and columns, wherein the aligned LBA is used to address a row of the look-up-table, and within the addressed row, a block address is stored for addressing the available block.

9. A controller as recited in claim 8 wherein the shifting means includes means for shifting the aligned LBA by a plurality of bits representing the number of sectors in a block for obtaining the block address and using the shifted aligned LBA to address said row of the look-up-table.

10. A controller as recited in claim 9 and further comprising means for concatenating the block address with the plurality of bits for addressing a particular sector of the available block.

* * * * *